United States Patent
Kawachi et al.

(10) Patent No.: US 7,157,991 B2
(45) Date of Patent: Jan. 2, 2007

(54) SURFACE ACOUSTIC WAVE DEVICE HAVING REFLECTORS WITH BOTH OPEN AND SHORTED ELECTRODES

(75) Inventors: Osamu Kawachi, Kanagawa (JP); Takuya Abe, Kanagawa (JP); Yasufumi Kaneda, Kanagawa (JP); Motoyuki Tajima, Kanagawa (JP)

(73) Assignee: Fujitsu Media Devices Limited, Kanagawa (JP)

( * ) Notice: Subject to any disclaimer, the term of this patent is extended or adjusted under 35 U.S.C. 154(b) by 455 days.

(21) Appl. No.: 10/746,255

(22) Filed: Dec. 29, 2003

(65) Prior Publication Data

US 2005/0003790 A1  Jan. 6, 2005

(51) Int. Cl.
*H03H 9/25* (2006.01)
*H03H 9/64* (2006.01)

(52) U.S. Cl. .................... 333/195; 310/313 D
(58) Field of Classification Search ............... 333/195; 310/313 D
See application file for complete search history.

(56) References Cited

U.S. PATENT DOCUMENTS

| 3,952,269 | A |   | 4/1976  | Bristol .................. 333/153 |
| 4,340,834 | A |   | 7/1982  | Sato .................... 310/313 D |
| 4,801,836 | A | * | 1/1989  | Mariani ................ 310/313 D |
| 5,175,711 | A | * | 12/1992 | Shiba et al. ............. 367/140 |
| 5,621,364 | A | * | 4/1997  | Ruile et al. ............. 333/195 |

FOREIGN PATENT DOCUMENTS

| DE | 3933006 A1 |   | 4/1990 |
| JP | 52-105752  |   | 9/1977 |
| JP | 61-281611  |   | 12/1986 |
| JP | 62-281611 A |  | 12/1987 |
| JP | 64-23131 U |   | 2/1989 |
| JP | 2000-13181 | * | 1/2000 |

* cited by examiner

*Primary Examiner*—Barbara Summons
(74) *Attorney, Agent, or Firm*—Arent Fox PLLC

(57) ABSTRACT

A surface acoustic wave device for implementing an attenuation characteristic outside of the pass band and the narrow band characteristics, preferably for use as a filter. The surface acoustic wave device includes a piezoelectric substrate, interdigital transducers formed on the piezoelectric substrate, and first and second reflectors disposed on the sides of the interdigital transducers. Each of the first and second reflectors includes an open electrode block with a plurality of electrically independent electrode fingers, and a short electrode block with a plurality of electrode fingers of which both ends are electrically shorted.

4 Claims, 9 Drawing Sheets

SURFACE ACOUSTIC WAVE DEVICE HAVING REFLECTORS WITH BOTH OPEN AND SHORTED ELECTRODES

CROSS-REFERENCE TO RELATED APPLICATION

This nonprovisional application claims the benefit of International Application No. PCT/JP01/11439, filed Dec. 26, 2001. The disclosure of the prior application is hereby incorporated herein in its entirety by reference.

TECHNICAL FIELD

The present invention relates to a surface acoustic wave device, and more particularly to a surface acoustic wave device which can implement the attenuation characteristic outside the pass band and the narrow band characteristics, and is preferable for use as a filter.

BACKGROUND ART

Recently radio devices, including portable telephones, cordless telephones and radio sets, are constantly becoming smaller and lighter, and their use is spreading rapidly. For the high frequency circuits of these radio devices, filter elements are used as critical key devices.

Therefore corresponding to the demands of smaller size and light weight for radio devices, smaller and lighter filter elements are demanded. As a configuration to make a filter element smaller and lighter, a surface acoustic wave device is used.

When the surface acoustic wave device is used as a filter, a critical issue is decreasing the insertion loss and increasing the attenuation amount outside the pass band in order to allow necessary signals to pass and to remove unnecessary signals. Also as the number of components decreases for downsizing the radio device main body, characteristics demanded for the surface acoustic wave device are becoming critical.

The surface acoustic wave device in the configuration example in FIG. 1 includes an interdigital transducer (IDT) 1 and reflectors 2 and 3, which are formed by electrode finger patterns provided on the piezoelectric substrate 100.

In the example in FIG. 1, the interdigital transducer (IDT) 1 includes three individual IDTs (these are hereafter called drive electrodes 1-1, 1-2 1-3), and the drive electrodes 1-1 and 1-2 are connected in parallel to the input terminal IN. The drive electrode 1-3 is connected to the output terminal OUT. The drive electrodes 1-1, 1-2 and 1-3 and the input terminal IN, and the output terminal OUT are connected respectively by lead wires which are connected to the electrode pad 4.

In the example in FIG. 1, the reflectors 2 and 3, which are disposed on both sides of the interdigital transducer 1, constitute a conventional grating electrode.

In this configuration, one possible method for implementing a narrower band is increasing the number of electrode fingers of the interdigital transducer 1. This however increases insertion loss. Another method of implementing a narrower band is decreasing stop band width by decreasing the reflection coefficient of the reflection electrodes 2 and 3, but this also has a tendency to increase insertion loss accordingly.

DISCLOSURE OF THE INVENTION

With the foregoing in view, the present inventor continued research and development on the configuration of the surface acoustic wave device which implements a narrower band without increasing insertion loss, and discovered that attenuation outside the pass band can be increased without increasing insertion loss, and fine filter characteristics in a narrow band can be implemented by forming the reflection electrode 2 and the reflection electrode 3 as blocks with different reflection coefficients.

Therefore based on this discovery, an object of the present invention is to provide a surface acoustic wave device which can decrease insertion loss in the pass band and present good narrow band characteristics.

The first aspect of the surface acoustic wave device for achieving the above object of the present invention includes a piezoelectric substrate, an interdigital transducer which is formed on the piezoelectric substrate and includes at least one drive electrode for driving surface acoustic waves, and reflectors which are disposed on both sides of the interdigital transducer, characterized in that the reflectors further include an open electrode block with a plurality of electrically independent electrode fingers, and a short electrode block with a plurality of electrode fingers of which both ends are electrically shorted.

The second aspect of the surface acoustic wave device for achieving the above object of the present invention is the surface acoustic wave device according to the first aspect, characterized in that the plurality of electrode fingers of the open electrode block of the reflectors are disposed at the first to eleventh position from the edge of the reflectors.

The third aspect of the surface acoustic wave device for achieving the above object of the present invention is the surface acoustic wave device according to the second aspect, characterized in that the number of the plurality of electrode fingers of the open electrode block of the reflectors is eight or less.

The fourth aspect of the surface acoustic wave device for achieving the above object of the present invention is the surface acoustic wave device according to the first aspect, characterized in that the open electrode block and the short electrode block of the reflectors are disposed symmetrically, and each one of the two open electrode blocks is disposed at the first to eleventh position from both edges of the reflector.

The fifth aspect of the surface acoustic wave device for achieving the above object of the present invention is the surface acoustic wave device according to the fourth aspect, characterized in that the number of the plurality of electrode fingers of the open electrode block of the reflectors is eight or less.

The sixth aspect of the surface acoustic wave device for achieving the above object of the present invention is the surface acoustic wave device according to one of the first to fifth aspects, characterized in that the plurality of electrode fingers of the open electrode block and the plurality of electrode fingers of the short electrode block are disposed with an interval of a half wavelength of the surface acoustic waves to be driven.

The seventh aspect of the surface acoustic wave device for achieving the above object of the present invention is characterized in that the number of the plurality of electrode fingers of the short electrode blocks in the first and second reflectors are different from each other.

The features of the present invention will be further clarified by the embodiments which will be described with reference to the accompanying drawings.

BEST MODE FOR CARRYING OUT THE INVENTION

Figure 1:
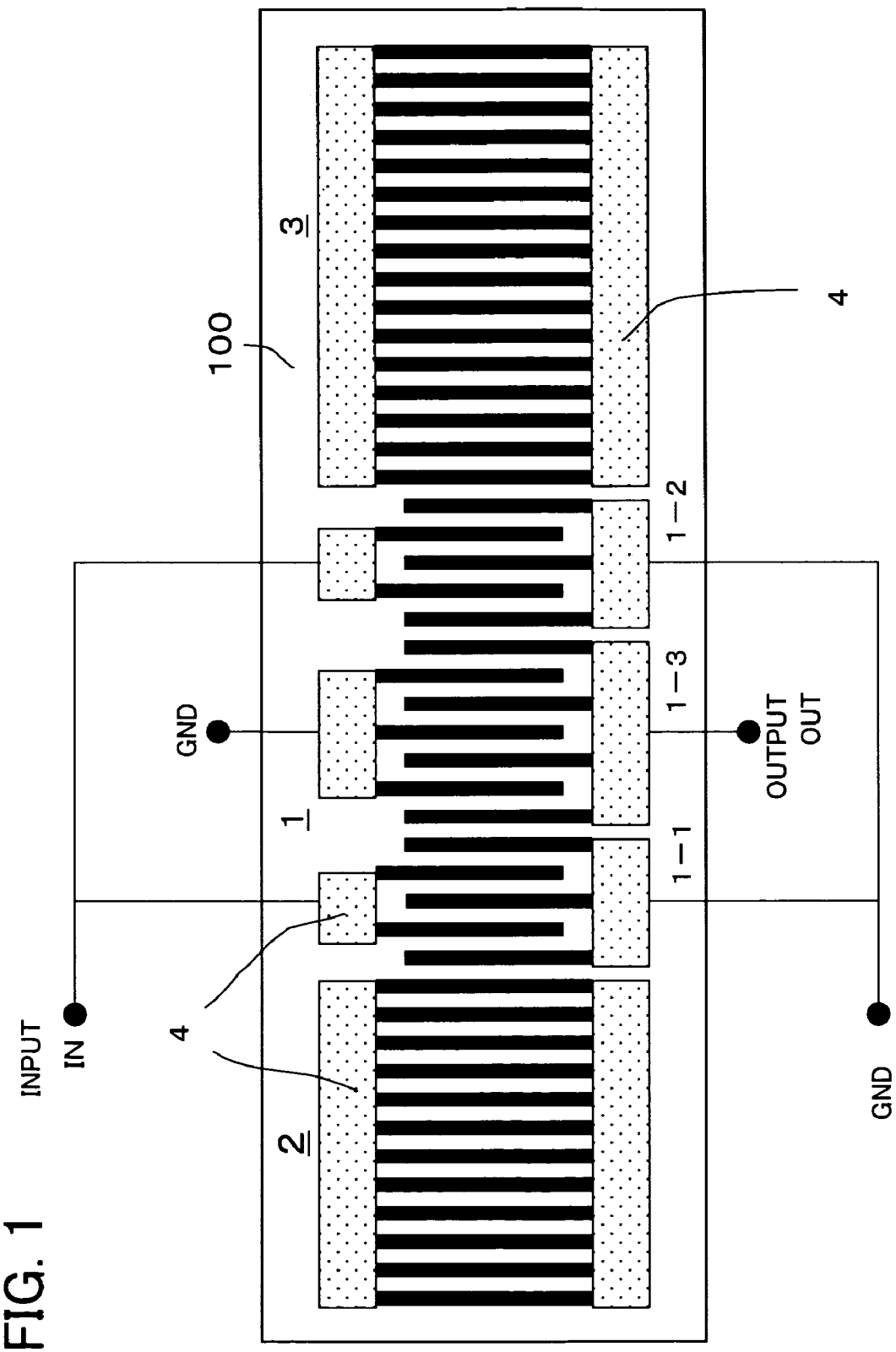
FIG. 1 is a diagram depicting a configuration example of the surface acoustic wave device.

Embodiments of the present invention will now be described with reference to the accompanying drawings. The embodiments shown in the drawings are for describing the present invention, and application of the present invention is not limited to these.

Figure 2:
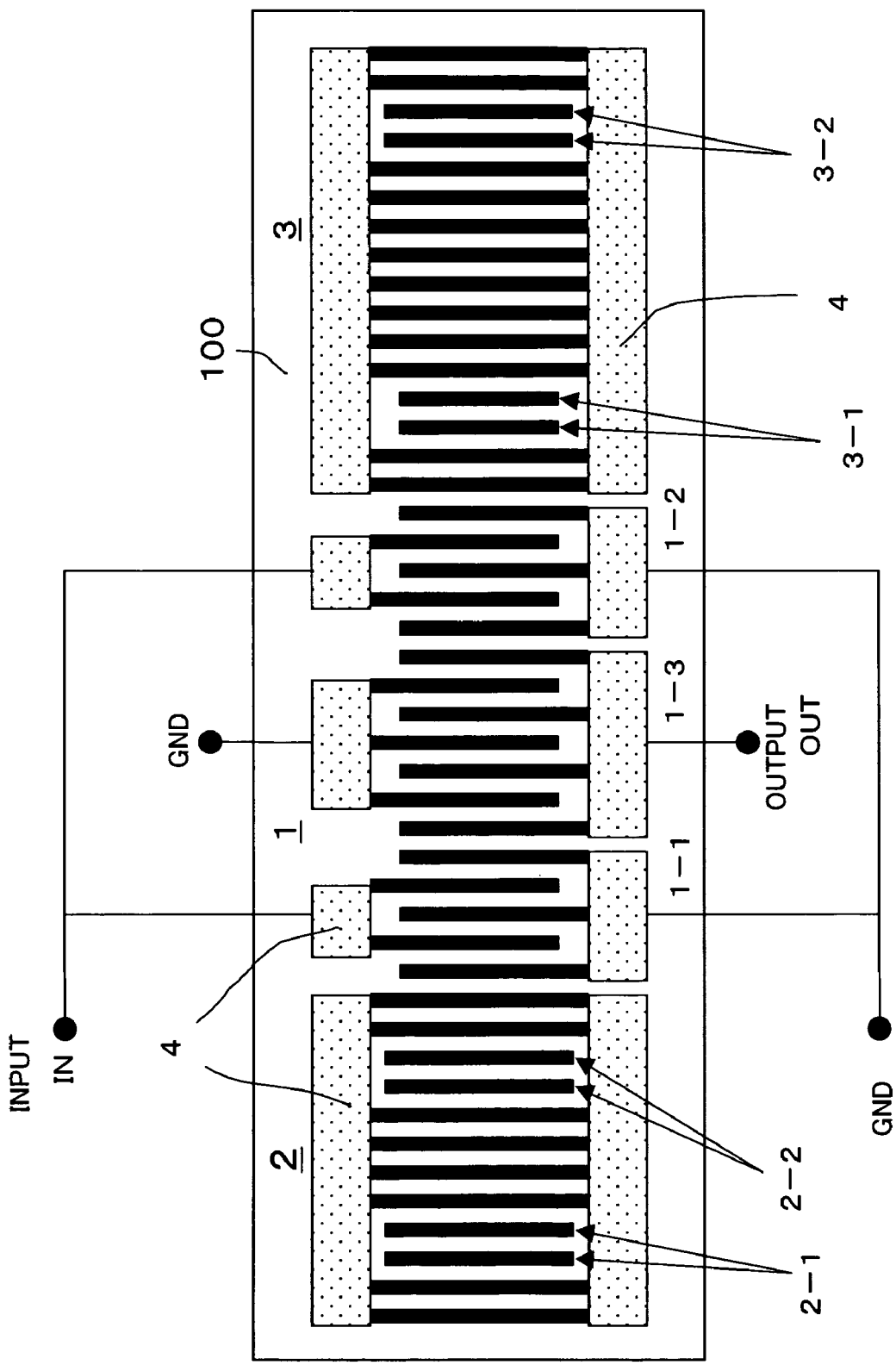
FIG. 2 is a diagram depicting an embodiment of the present invention.

FIG. 2 is an embodiment of the present invention, and just like the configuration shown in FIG. 1, electrode fingers, of which the main component is Al, are formed on the LiTaO$_3$ or LiNbO$_3$ piezoelectric substrate 100, and the interdigital transducer (IDT) 1, which has three drive electrodes 1-1, 1-2 and 1-3, is cascade-connected between the two reflectors 2 and 3.

As a feature of the present invention, the difference from the configuration in FIG. 1 is that the reflectors 2 and 3 are comprised of a plurality of blocks having different reflection coefficients. In other words, each one of the reflectors 2 and 3 has three blocks with different reflection coefficients, and the blocks with different reflection coefficients are divided into a short electrode block where the electrode fingers are shorted by the electrode pad 4, and an open electrode block where the electrode fingers are not connected to the electrode pad 4.

In other words, in the short electrode block, both ends of the plurality of electrode fingers are connected to the electrode pad 4 to be shorted, and the open electrode block is formed with independent electrode fingers separated from the electrode pad 4.

In the example shown in FIG. 2, the reflector 2 is comprised of two open electrode blocks, which have open electrodes 2-1 and 2-2 respectively, and three short electrode blocks having short electrodes, which are adjacent to the open electrode blocks. In the same way, the reflector 3 is includes two open blocks having open electrodes 3-1 and 3-2 respectively, and three short electrode blocks having short electrodes, which are adjacent to the open electrode blocks.

According to the present invention, the surface acoustic wave device including the reflectors which have such open electrode blocks and short electrode blocks is characterized by the number of open electrode fingers constituting the open electrode block of the reflectors and the positions thereof, concerning attenuation outside the pass band and the narrow band characteristics.

FIG. 3 shows an example when the reflector is comprised of 200 electrode fingers.

Figure 3A:
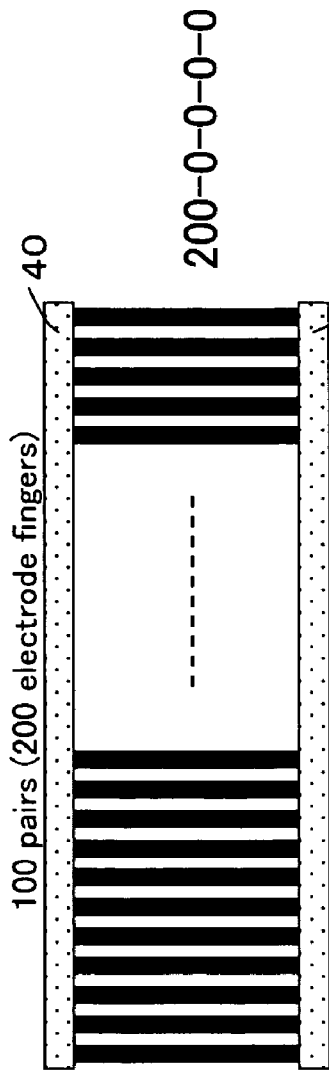
FIG. 3 are diagrams depicting an embodiment when the reflector is constructed with 200 electrode fingers.

FIG. 3A is a configuration of a reflector of prior art, where both ends of all the 200 electrode fingers included in the reflector are commonly shorted by the electrode pads 40 and 41, and is comprised of only one short electrode block. In this case, the reflector has only a single reflection coefficient.

The configuration of this reflector is expressed as (200-0-0-0-0) with the left end of the reflector as a reference. In other words, when the left end is the reference, the reflector shown in FIG. 3A shows that the electrode finger at the left end is a short electrode, and the rest of the electrode fingers are also short electrodes, therefore all 200 (100 pairs) electrode fingers are short electrodes.

Figure 3B:
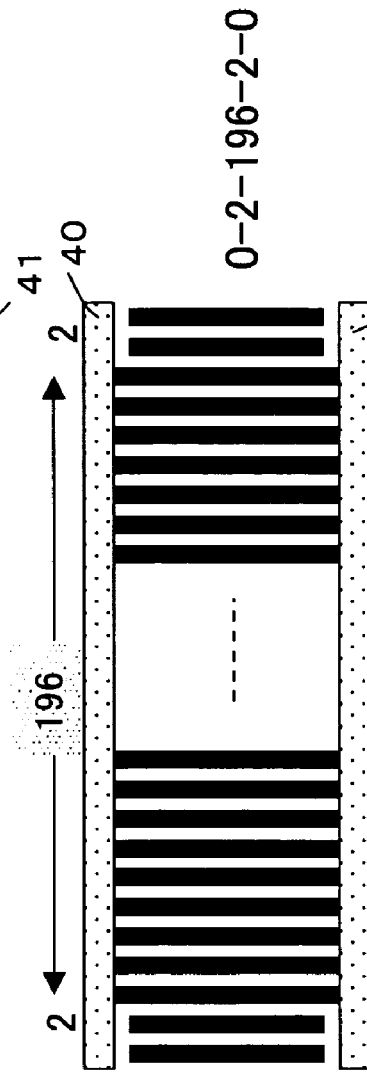

In the configuration of the reflector shown in FIG. 3B, the two electrode fingers are open electrodes, the next 196 electrode fingers are short electrodes, and two electrode fingers at the right end are open electrodes when the left end of the reflector is the reference. This configuration is expressed as (0-2-196-2-0).

Figure 3C:
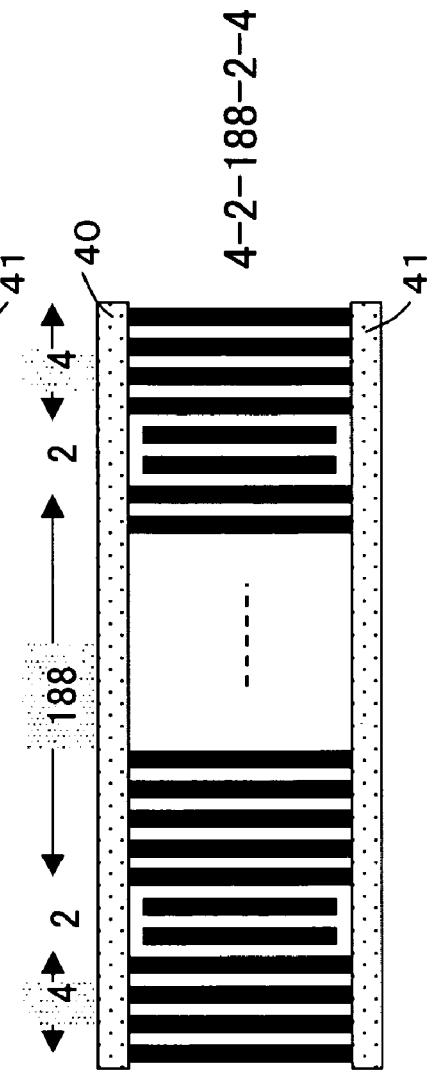

In the configuration shown in FIG. 3C, the four electrode fingers are short electrodes, the next two electrode fingers are open electrodes, and the next 188 electrode fingers are short electrodes when the left end of the reflector is the reference. Then the next two electrode fingers are open electrodes and the next four electrode fingers are short electrodes. This configuration is expressed as (4-2-188-2-4).

Figure 4A:
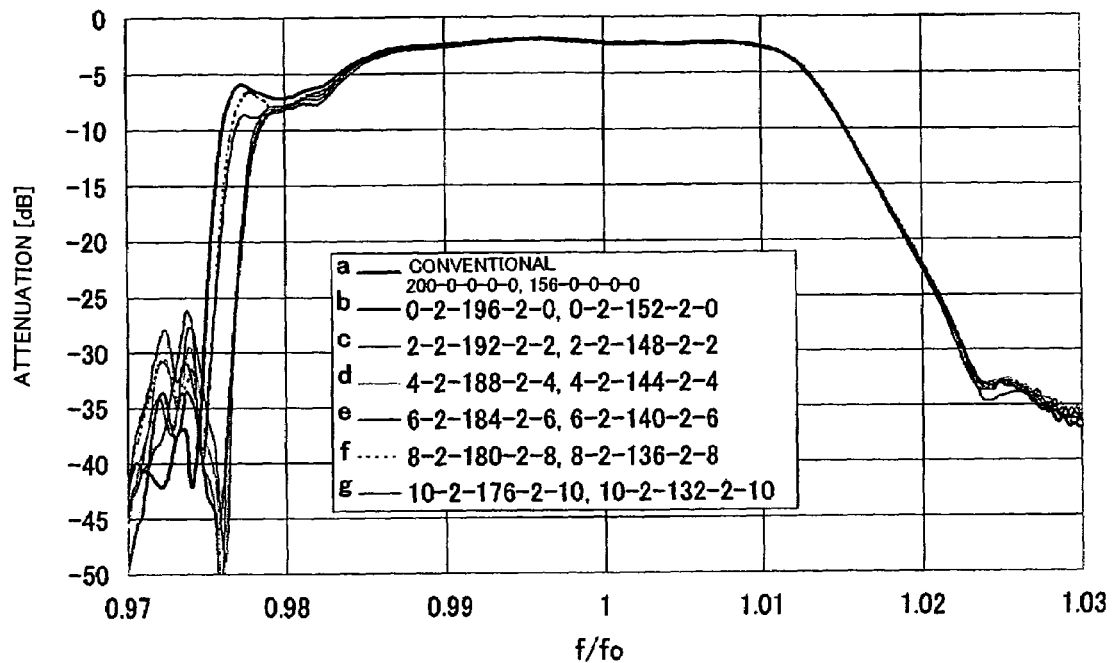
FIG. 4 is a diagram depicting the change of the passing characteristic in the configuration of the embodiment in FIG. 2 when the position of the open electrode is changed inward with the left end of the reflector as a reference.
Figure 4B:
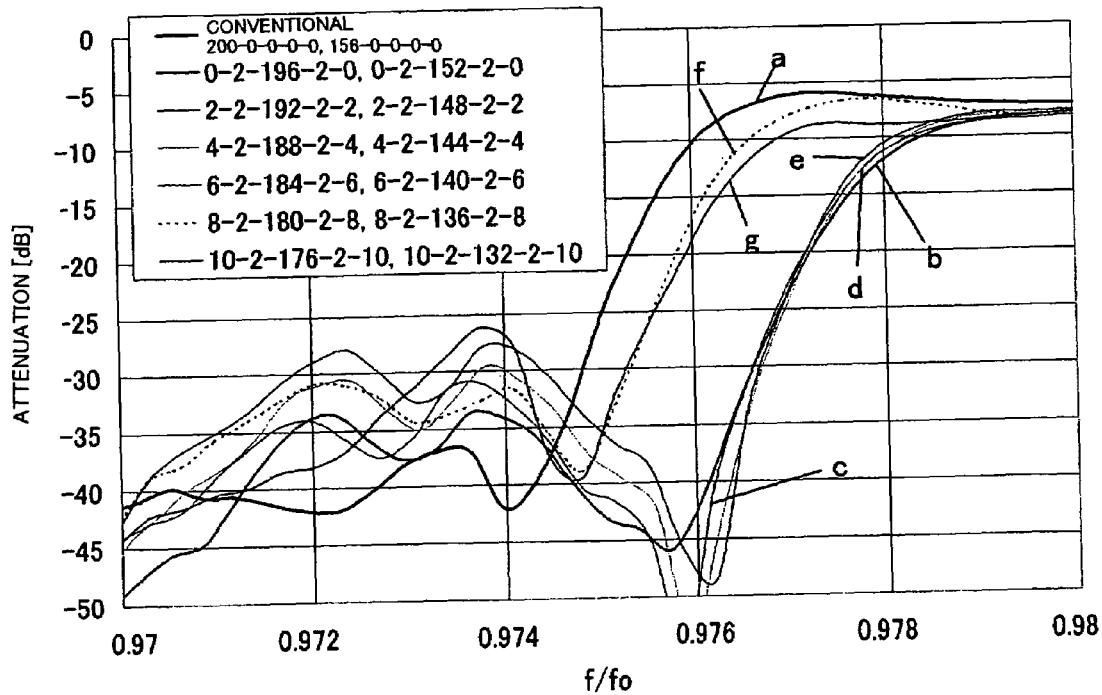

FIG. 4 shows the change of the passing characteristic in the surface acoustic wave device when the two reflectors 2 and 3 are comprised of 156 and 200 electrode fingers respectively, and the position of the pair (two electrode fingers) of open electrodes is changed inward with the left end of the reflectors as the reference. FIG. 4A shows passing characteristics as a whole, and FIG. 4B is a diagram when a part of FIG. 4A is enlarged to clarify the difference in each characteristic.

As the description in FIG. 3 shows, the surface acoustic wave device 'b', which has the reflector 3 defined by (0-2-196-2-0) or the reflector 2 defined by (0-2-152-2-0), has a configuration where two open electrodes are disposed on both end sides of the reflector respectively in FIG. 4.

In the same way, the surface acoustic wave device 'c', which has the reflector 3 defined by (2-2-192-2-2) or the reflected 2 defined by (2-2-148-2-2), has a configuration where two short electrodes are disposed on both end sides of the reflector and two open electrodes are positioned inside thereof.

The surface acoustic wave device 'd', which has the reflector 3 defined by (4-2-188-2-4) or the reflector 2 defined by (4-2-144-2-4), has four short electrodes at both end sides of the reflector and two open electrodes are positioned inside thereof.

The surface acoustic device 'e', which has the reflector 3 defined by (6-2-184-2-6) or the reflector 2 defined by (6-2-140-2-6), has six short electrodes at both end sides of the reflector and two open electrodes are positioned inside thereof.

The surface acoustic wave device 'f', which has the reflector 3 defined by (8-2-180-2-8) or the reflector 2 defined by (8-2-136-2-8), has a configuration where eight short electrodes are disposed on both end sides of the reflector and two open electrodes are positioned inside thereof.

The surface acoustic wave device 'g', which has the reflector 3 defined by (10-2-176-2-10) or the reflector 2 defined by (10-2-132-2-10), has a configuration where ten short electrodes are disposed on both end sides of the reflector and two open electrodes are positioned inside thereof.

As the characteristic diagram in FIG. 4 shows, the passing characteristic changes by positioning the open electrodes inside of both the ends with respect to the characteristic of the surface acoustic wave device 'a' when all electrode fingers are short electrodes.

By this change of the passing characteristic, the attenuation and shape factor outside the pass band changes. As FIG. 4 shows, in the passing characteristic of the conventional surface acoustic wave device 'a' shown in FIG. 1 where all electrode fingers are short electrodes, the attenuation outside the pass band is −25dB when the frequency value normalized by the central frequency $(f/f_0)=0.975$.

Here if the ratio between the band width (3 dBBW) at the minimum attenuation (−3 dB) and the band width (25 dBBW) at attenuation outside the passing band (−25 dB) is defined as the shape factor, then the shape factor with respect to the characteristic of the surface acoustic wave device 'a' when all electrode fingers are short electrodes is 0.537.

As the shape factor becomes closer to 1, the attenuation characteristic outside the pass band near the pass band width becomes sharper, which is a good narrow band characteristic.

Figure 5:
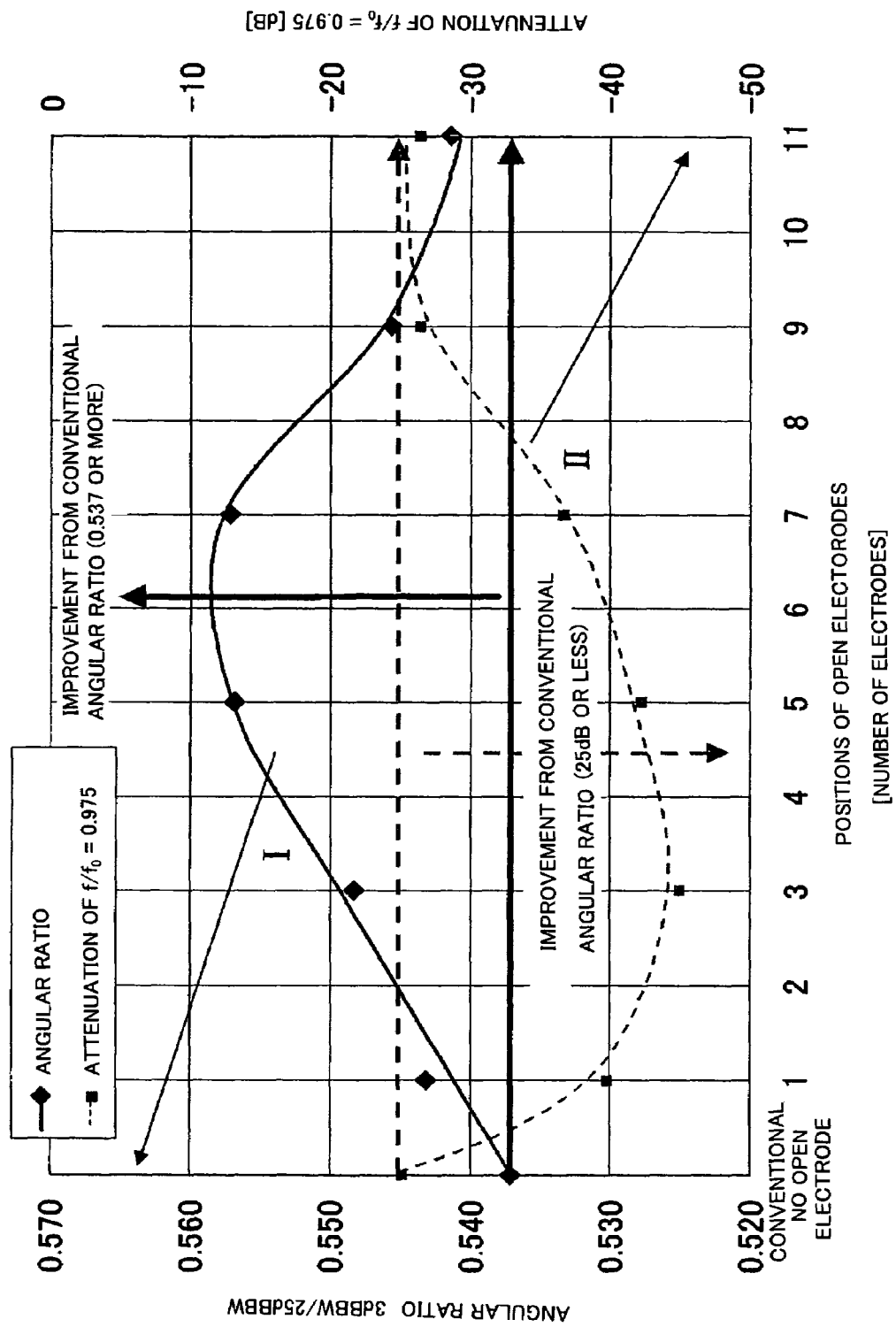
FIG. 5 is a graph indicating the change of attenuation and shape factor of the filter which are measured with changing the position of the open electrode.

FIG. 5 is a graph comparing the attenuation and shape factor outside the pass band in the surface acoustic wave devices 'b' to 'g', which have reflectors where the open electrodes are at different positions respectively, with respect to the characteristics of the surface wave device 'a' where all electrode fingers are short electrodes.

FIG. 5 shows the case when there is one open electrode position corresponding to the reflector 'b', and is the configuration shown in FIG. 3B where the first and second electrode fingers at both end sides of the reflector are open electrodes.

The case when there are three open electrode positions is the configuration of the reflector where the first and second electrode fingers from both end sides of the reflector are short electrodes, and the third and fourth electrode fingers are open electrodes. This corresponds to the configuration of the reflector of the surface acoustic wave device 'c' shown in FIG. 4.

In the same way, in FIG. 5, the case when there are five open electrode positions is the configuration where the first to fourth electrode fingers from both end sides of the reflector are short electrodes, and the fifth and sixth electrode fingers are open electrodes. This corresponds to the configuration of the reflector of the surface acoustic wave device 'd' shown in FIG. 4.

The case when there are seven open electrode positions is the configuration of the reflector where the first to sixth electrode fingers from both end sides of the reflector are short electrodes, and the seventh and eighth electrode fingers are open electrodes. This corresponds to the configuration of the reflector of the surface acoustic wave device 'e' shown in FIG. 4.

The case when there are nine open electrode positions is the configuration of the reflector where the first to eighth electrode fingers from both end sides of the reflector are short electrodes, and the ninth and tenth electrode fingers are open electrodes. This corresponds to the configuration of the reflector of the surface acoustic wave device 'f' shown in FIG. 4.

The case when there are eleven open electrode positions is the configuration of the reflector where the first to tenth electrode fingers from both end sides of the reflector are short electrodes, and the eleventh and twelfth electrode fingers are open electrodes. This corresponds to the configuration of the reflector of the surface acoustic wave device 'g' shown in FIG. 4.

As FIG. 5 shows, when the open electrode positions of the reflector are in a range of the first to eleventh electrode fingers from both end sides, both the attenuation characteristic II and the shape factor characteristic I outside the passing band can be improved compared with the characteristics of the surface acoustic wave device 'a' which has a reflector with all short electrodes.

Here based on the research of the present inventor, it was discovered that the shape factor and the attenuation outside the pass band can be improved by increasing the number of pairs of the open electrodes compared with the case of having a reflector where all open electrodes.

Figure 6:
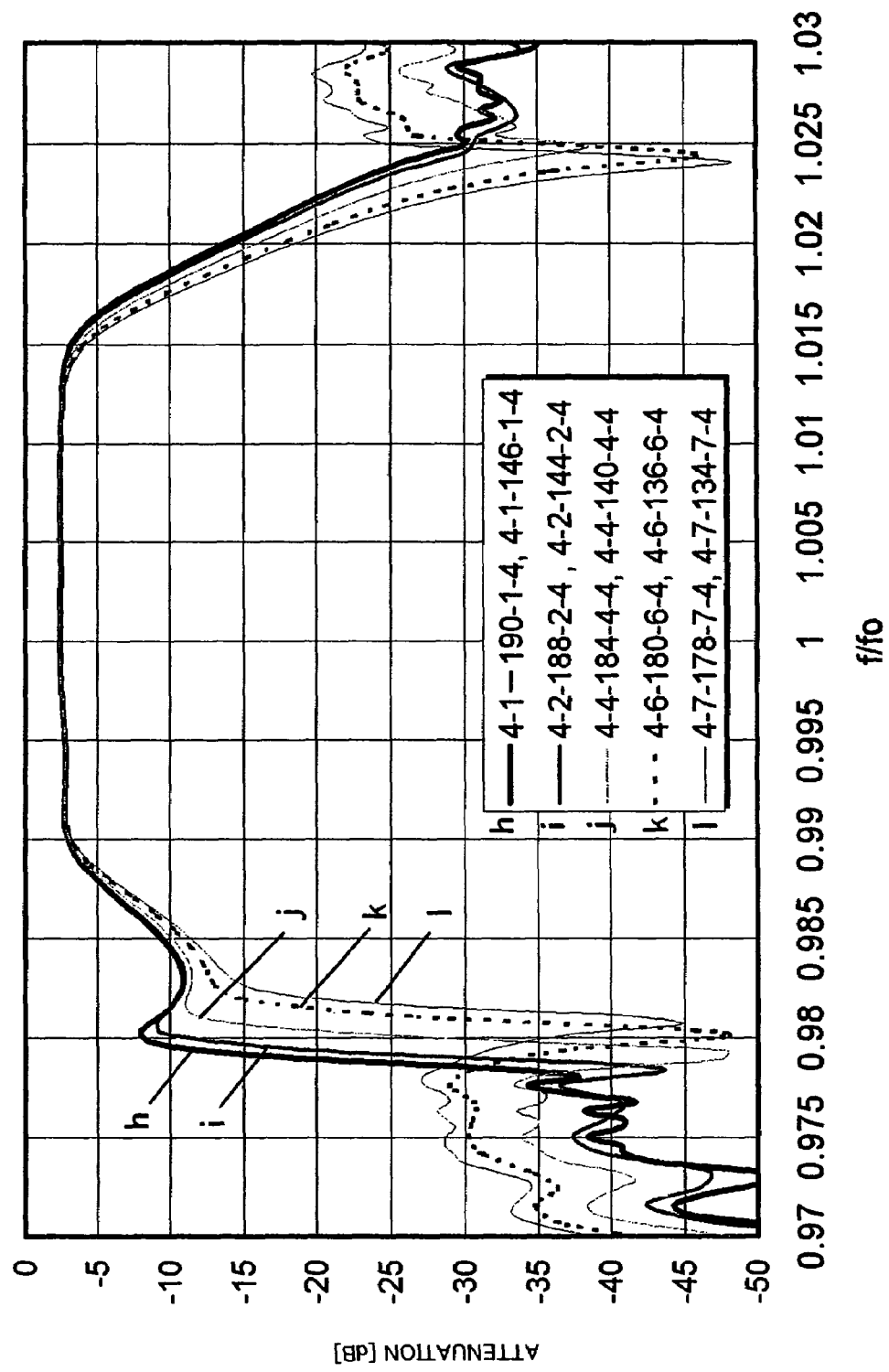
FIG. 6 is a graph indicating the frequency characteristic of the filter when the number of open electrodes is changed.

FIG. 6 is a diagram depicting the pass band characteristic of the surface acoustic wave device when the open electrodes are disposed from the fifth electrode finger from both end sides of the reflector, that is, four short electrodes are disposed on both end sides, and open electrodes are disposed inside thereof, and when the number of the open electrodes of the reflector is changed from one to seven.

In FIG. 6, the surface acoustic wave device 'h' has a configuration where one open electrode is disposed inside the four short electrodes at both ends of the reflector.

The surface acoustic wave device 'i' has a configuration where two open electrodes are disposed inside the four short electrodes at both ends of the reflector. This configuration corresponds to the configuration of the reflector of the surface acoustic wave device d in FIG. 4 and FIG. 5.

The surface acoustic wave device 'j' has a configuration where four open electrodes are disposed inside the four short electrodes at both ends of the reflector.

The surface acoustic wave device 'k' has a configuration where six open electrodes are disposed inside the four short electrodes at both ends of the reflector.

The surface acoustic wave device '1' has a configuration where seven open electrodes are disposed inside the four short electrodes at both ends of the reflector.

As FIG. 6 shows, in the case of increasing the number of open electrodes as well, the passing characteristic is changed by increasing the number of open electrodes with compared with the characteristics of the surface acoustic wave device 'a' which has a reflector with all short electrodes.

Figure 7:
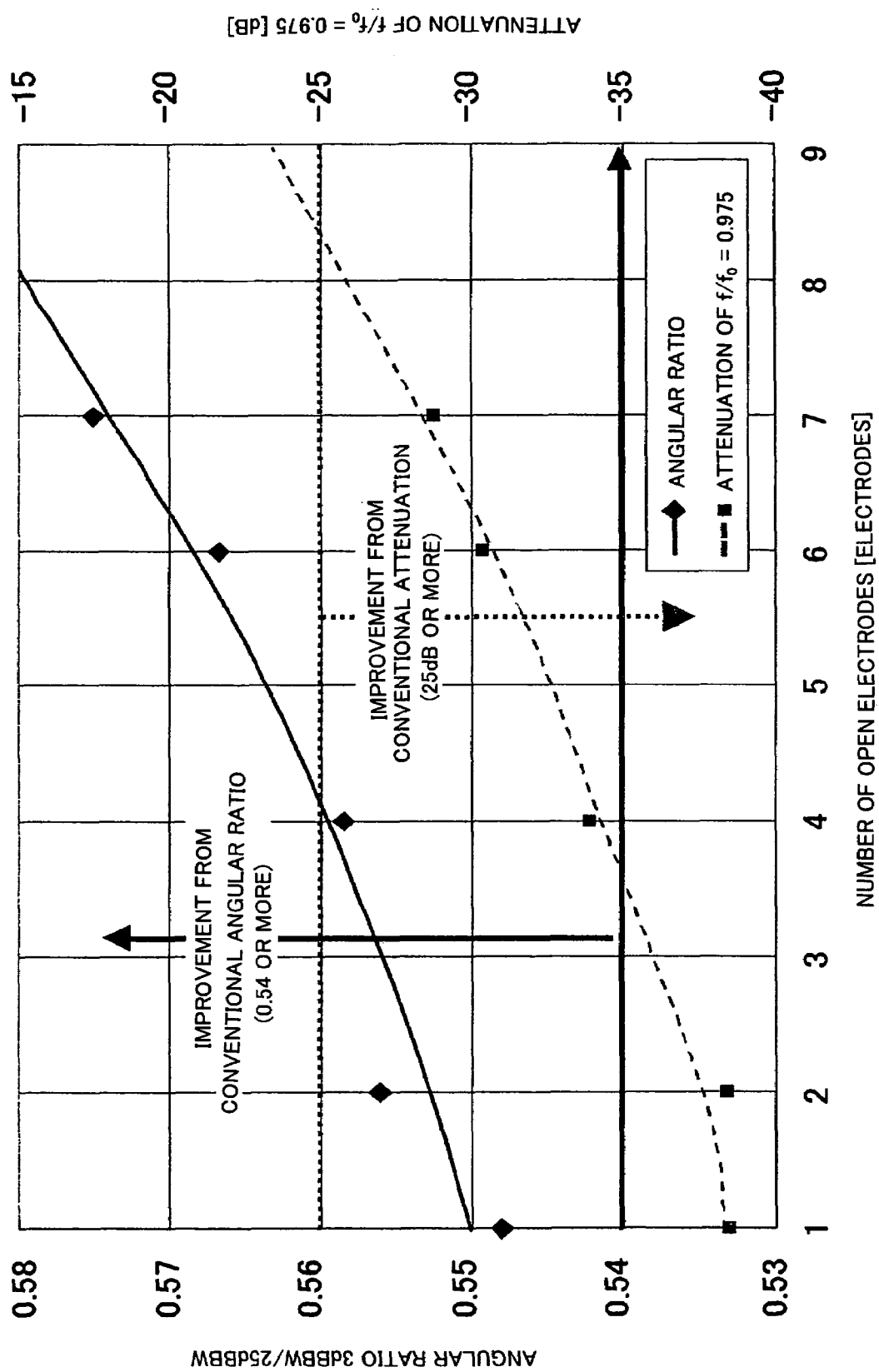
FIG. 7 is a graph indicating the simulation result of the change of attenuation and shape factor of the filter when the number of open electrodes is changed.

FIG. 7 is a graph indicating the simulation results of the changes of the attenuation and the shape factor outside the pass band in the surface acoustic wave devices 'h' to 'L', which have reflectors where the number of open electrodes is increased respectively, compared with the characteristics of the surface acoustic wave device 'a', which has a reflector with all short electrodes.

The shape factor in the surface acoustic wave device which has a reflector with all short electrodes is 0.54, and compared with this, the shape factor improves by increasing the number of open electrodes. On the other hand, the attenuation outside the band decreases if the number of open electrodes is increased, but when the number of open electrodes is four to eight, the shape factor in the surface acoustic wave device which has a reflector with all short electrodes is improved more than 0.54, and attenuation can be 25 dB or more.

The above example shows the case when the open electrode fingers in the reflector are arranged symmetrically.

However application of the present invention is not limited to the case when the open electrode fingers are arranged symmetrically.

Figure 8A:
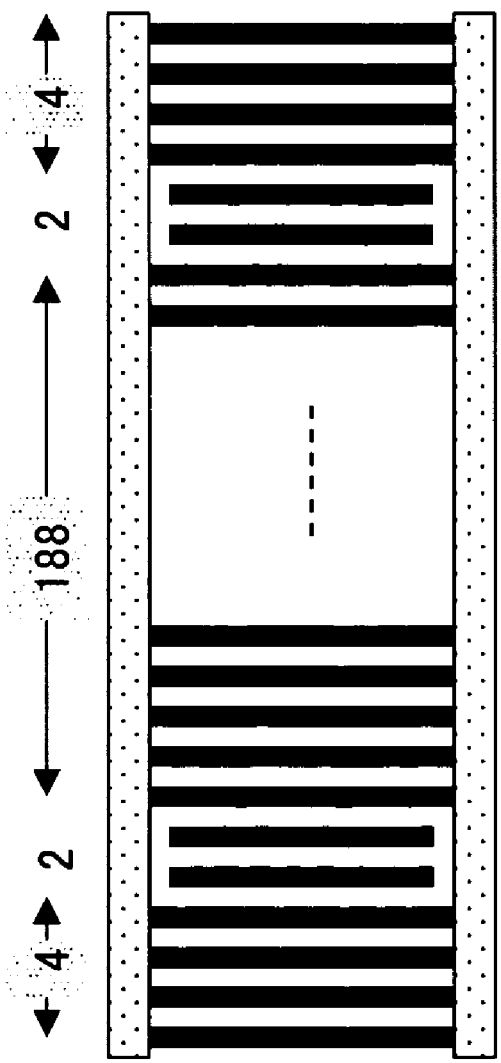
FIG. 8 is a diagram depicting the arrangement of the open electrode fingers in the reflectors.

FIG. 8 is a diagram depicting the arrangement of the open electrode fingers in reflectors, where FIG. 8A is the case when the open electrode fingers in the reflector are arranged symmetrically, and corresponds to the reflector of the surface acoustic wave device 'd' in the example in FIG. 4 (or the reflector of the surface acoustic wave device 'i' in the example in FIG. 6).

The configuration of the reflector shown in FIG. 8A is that four short electrode fingers are disposed at both ends, and two open electrode fingers are disposed inside thereof, and the arrangement is symmetrical.

Figure 8B:
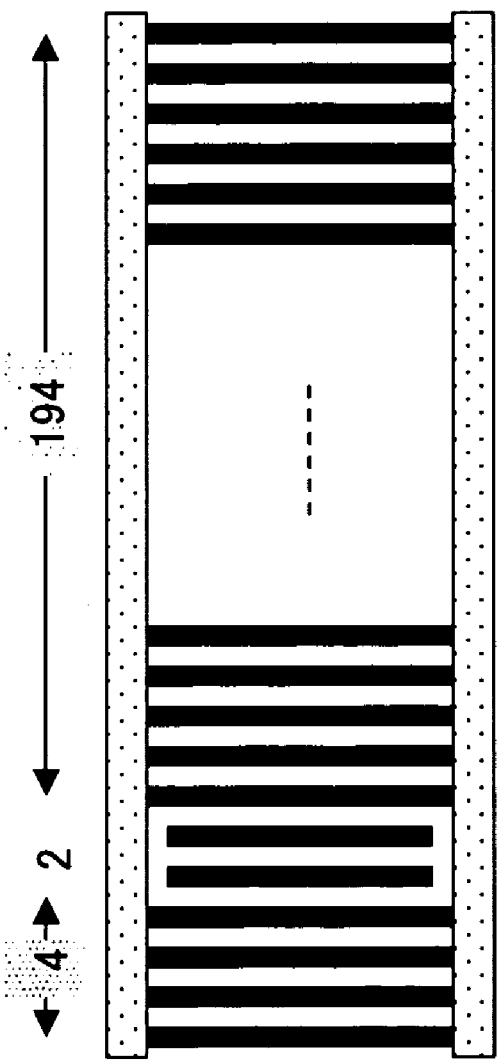

The configuration of the reflector shown in FIG. 8B, on the other hand, is that four short electrode fingers are disposed at the left end, and two open electrode fingers are disposed inside thereof. And short electrode fingers are disposed from inside the two open electrode fingers up to the right end, and the arrangement of the electrode fingers is asymmetrical.

Figure 9:
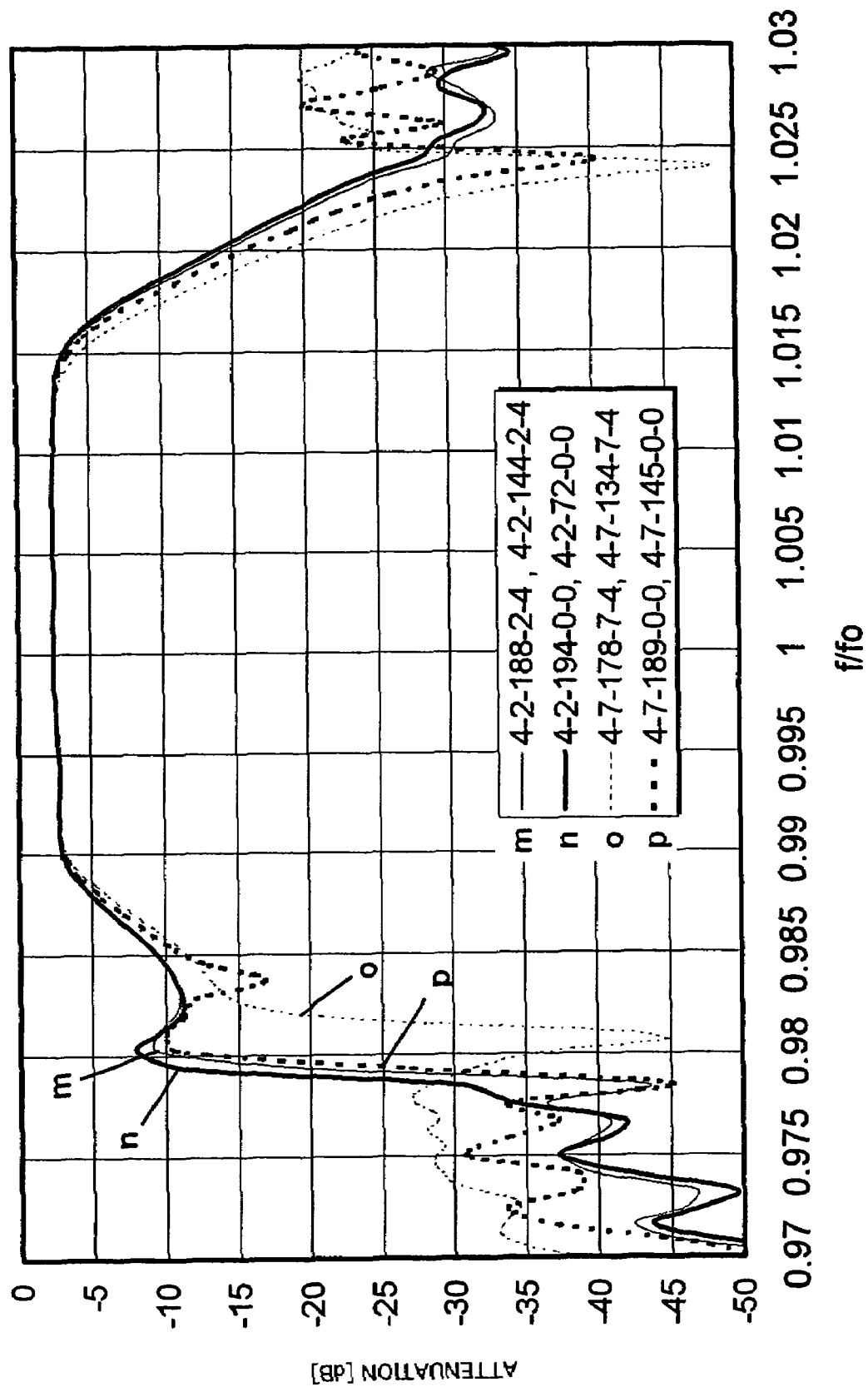
FIG. 9 is a passing characteristic diagram comparing the case when the open electrode fingers are disposed symmetrically and the case when disposed asymmetrically.

FIG. 9 is a graph comparing the pass band characteristic of the surface acoustic wave device when the open electrode fingers are disposed symmetrically and when they are disposed asymmetrically.

The reflector of the surface acoustic wave device 'm' has a configuration where four short electrode fingers are disposed from both ends, and two open electrode fingers are disposed inside thereof, which is the configuration shown in FIG. 8A. Whereas the reflector of the surface acoustic wave device 'n' has an asymmetrical configuration where four short electrode fingers are disposed at the left end, two open electrode fingers are disposed inside thereof, and short electrode fingers are disposed from inside the two open electrode fingers up to the right end.

The reflector of the surface acoustic wave device 'o' has a configuration where four short electrode fingers are disposed from both ends, and seven open electrode fingers are disposed inside thereof. Whereas the reflector of the surface acoustic wave device 'p' has an asymmetrical configuration where four short electrode fingers are disposed at the left end, seven open electrode fingers are disposed inside thereof, and short electrode fingers are disposed from inside the seven open electrode fingers up to the right end.

In the comparison of the surface acoustic wave device 'm' and 'n', and the comparison of the surface acoustic wave devices 'o' and 'p', the surface acoustic wave device where the open electrode fingers of the reflector are disposed symmetrically has a larger attenuation outside the pass band in both cases.

However, by the configuration where the reflector has open electrode fingers according to the present invention, the attenuation outside the band is improved, and a narrower band can be implemented compared with the case when the electrode fingers of the reflector are all short electrodes. Therefore the application of the present invention is not limited to the case when open electrode fingers are disposed symmetrically in the reflector of the surface acoustic wave device.

INDUSTRIAL APPLICABILITY

As the above description on the embodiments with reference to the drawings show, the present invention can provide a surface acoustic wave device, which has a large attenuation outside the pass band, and can decrease the insertion loss in the pass band, and can implement good narrow band characteristics.

What is claimed is:

1. A surface acoustic wave device, comprising:
   a piezoelectric substrate;
   intedigital transducers which are formed on said piezoelectric substrate and includes at least one drive electrode for driving surface acoustic waves; and
   first and second reflectors which are disposed on both sides of said interdigital transducers,
   wherein each of said first and second reflectors includes an open electrode block with a plurality of electrically independent electrode fingers, and a short electrode block with a plurality of electrode fingers of which both ends are electrically shorted,
   wherein the open electrode block and the short electrode block of said first and second reflectors are disposed symmetrically, and each one of the two open electrode blocks is disposed at the first to eleventh positions from both ends of said reflector.

2. The surface acoustic wave device according to claim 1, wherein the number of the plurality of electrode fingers of the open electrode block of said first and second reflectors is eight or less.

3. The surface acoustic wave device according to claim 1, wherein the plurality of electrode fingers of said open electrode block and the plurality of electrode fingers of the short electrode block are disposed with an interval of a half wavelength of the surface acoustic waves to be driven.

4. The surface acoustic wave device according to claim 1, wherein the numbers of the plurality of electrode fingers of the short electrode blocks in said first and second reflectors are different from each other.

* * * * *

UNITED STATES PATENT AND TRADEMARK OFFICE
CERTIFICATE OF CORRECTION

PATENT NO. : 7,157,991 B2  
APPLICATION NO. : 10/746255  
DATED : January 2, 2007  
INVENTOR(S) : Kawachi et al.

Page 1 of 1

It is certified that error appears in the above-identified patent and that said Letters Patent is hereby corrected as shown below:

On title page
    Please insert the following:

Item -- (63) Related U.S. Application Data Continuation of application No. PCT/JP01/11439, filed on December 26, 2001. --

Item -- (30) Foreign Application Priority Data July 3, 2001 (JP)........... 2001-202654 --

Signed and Sealed this

Tenth Day of July, 2007

JON W. DUDAS  
*Director of the United States Patent and Trademark Office*